(12) United States Patent
Wang (10) Patent No.: US 9,048,877 B2
(45) Date of Patent: Jun. 2, 2015

(54) TURBO CODE PARALLEL INTERLEAVER AND PARALLEL INTERLEAVING METHOD THEREOF

(75) Inventor: Yi Wang, Shenzhen (CN)

(73) Assignee: ZTE Corporation, Shenzhen (CN)

( * ) Notice: Subject to any disclaimer, the term of this patent is extended or adjusted under 35 U.S.C. 154(b) by 120 days.

(21) Appl. No.: 13/825,886

(22) PCT Filed: Mar. 25, 2011

(86) PCT No.: PCT/CN2011/072187
§ 371 (c)(1),
(2), (4) Date: Mar. 25, 2013

(87) PCT Pub. No.: WO2012/037807
PCT Pub. Date: Mar. 29, 2012

(65) Prior Publication Data
US 2013/0198592 A1    Aug. 1, 2013

(30) Foreign Application Priority Data

Sep. 25, 2010  (CN) .......................... 2010 1 0293964

(51) Int. Cl.
*H03M 13/29*    (2006.01)
*H03M 13/27*    (2006.01)
*H04L 1/00*    (2006.01)
*H03M 13/39*    (2006.01)

(52) U.S. Cl.
CPC ...... *H03M 13/2903* (2013.01); *H03M 13/2775* (2013.01); *H03M 13/2957* (2013.01); *H03M 13/3972* (2013.01); *H03M 13/271* (2013.01)

(58) Field of Classification Search
None
See application file for complete search history.

(56) References Cited

U.S. PATENT DOCUMENTS

| 7,155,642 | B2 | 12/2006 | Han |
| 7,236,591 | B2 | 6/2007 | Sim |
| 7,734,989 | B2 | 6/2010 | Kutz et al. |
| 8,719,658 | B2 * | 5/2014 | Cui et al. ...................... 714/763 |

FOREIGN PATENT DOCUMENTS

CN    1349357 A    5/2002

OTHER PUBLICATIONS

International Search Report corresponding to International Patent Application No. PCT/CN2011/072187 dated Jul. 7, 2011.
Written Opinion of the International Searching Authority corresponding to International Patent Application No. PCT/CN2011/072187 dated Jul. 7, 2011.

* cited by examiner

*Primary Examiner* — Justin R Knapp
(74) *Attorney, Agent, or Firm* — Jenkins, Wilson, Taylor & Hunt, P.A.

(57) ABSTRACT

A Turbo code parallel interleaver and a parallel interleaving method are disclosed by the disclosure. The Turbo code parallel interleaver comprises: an interleaving unit, configured to generate a column address for parallel-reading data and a row address of each row of data being row-interleaved, input the column address and the column address after delay to a CB matrix unit, input the row address of each row to a switching output unit, and input the row address of each row after delay to a switching input unit; a switching output unit, configured to receive the data of each row output by the CB matrix unit, perform the inter-row interleaving for the data of each row according to the row address of each row, and input the interleaved data to a parallel MAP unit for the MAP computing; and a switching input unit.

13 Claims, 3 Drawing Sheets

|        | Column 15 | Column 14 |     | Column 2 | Column 1 | Column 0 |
|--------|-----------|-----------|-----|----------|----------|----------|
| Row 0  | c383      | c382      | ... | c2       | c1       | c0       |
| Row 1  | c767      | c766      | ... | c386     | c385     | c384     |
| Row 2  | c1151     | c1150     | ... | c770     | c769     | c768     |
| ⋮      |           |    CB matrix    |     |          |          |          |
| Row 14 | c5760     | c5759     | ... | c5378    | c5377    | c5376    |
| Row 15 | c6143     | c6142     | ... | c5763    | c5762    | c5761    |

TURBO CODE PARALLEL INTERLEAVER AND PARALLEL INTERLEAVING METHOD THEREOF

CROSS-REFERENCE TO RELATED APPLICATIONS

This application is filed under the provisions of 35 U.S.C. §371 and claims the priority of International Patent Application No. PCT/CN2011/072187 filed on Mar. 25, 2011, and of Chinese Patent Application No. 201010293964.1 filed on Sep. 25, 2010. The disclosures of the foregoing international patent application and Chinese patent application are hereby incorporated by reference herein in their respective entireties.

FIELD OF THE INVENTION

The disclosure relates to the Turbo decoding process technology in the communication field, and more particularly to a Turbo code parallel interleaver and a parallel interleaving method thereof.

BACKGROUND OF THE INVENTION

The Turbo code, an important channel coding method in the LTE, features high complexity and long time-delay in the coding & decoding, but excellent bit error performance. Therefore, it is suitable for the data transmission of the long code block (CB) with large quantities of data and with low time-delay requirements. The successful factors of the Turbo code lie in that: it can very well meet the randomicity condition in the Shannon's channel coding theory and it obtains coding gains by adopting the iterative decoding method, thus realizing the extreme performance approaching the Shannon limit.

Figure 1:
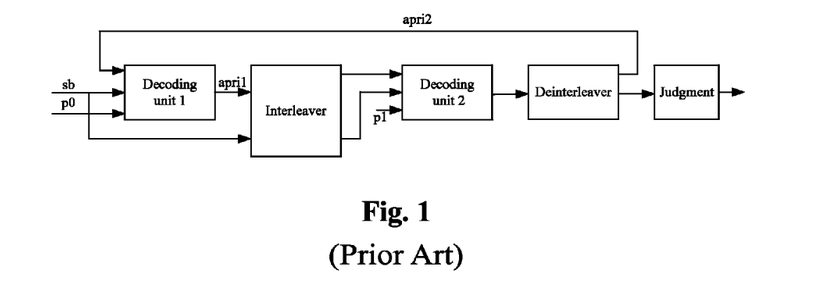
FIG. 1 is a schematic diagram of the structure of the Turbo decoder according to the related art.

FIG. 1 is a diagram of the structure of a Turbo decoder consisting of two soft-input soft-output (SISO) Recursive Systematic Convolutional (RSC) code component decoding units. The two units are connected through an interleaver and a deinterleaver for the iterative decoding. The extrinsic information apri1 output by the decoding unit 1 is used as the prior information of the decoding unit 2, and assists the decoding of the decoding unit 2. Likewise, the extrinsic information apri2 output by the decoding unit 2 is used as the prior information of the decoding unit 1. Iterative decoding is repeated in this way. The structures of the hardware of the decoding unit 1 and the decoding unit 2 are totally the same. During the hardware realization, time division multiplex can be used to save hardware resources. The decoding unit 1 and the decoding unit 2 are mainly to realize the Max-Log-Map algorithm of the data domain, wherein the multiplication and the exponent operation are simplified as the addition operation and the operation for taking the maximum, so as to reduce the computational complexity and facilitating the hardware realization. For the parallel Turbo decoder, the core is to set several parallel Max-Log-Map computing units in the decoding unit 1 and the decoding unit 2, so as to make the decoder perform segment decoding simultaneously for the data of the same CB.

The interleaver directly affects the performance of the Turbo decoder and plays a key role in the Turbo decoder. The interleaver adopted by the LTE is a Quadratic Permutation Polynomial (QPP) interleaver, which is one kind of Contention-free (CF) interleavers and whose expression is $\Pi(i)=(f_1 \cdot i + f_2 \cdot i^2) \bmod K$ (Formula 1-1), wherein $i$ and $\Pi(i)$ are the serial numbers before and after the interleaving, K is the CB length, and f1 and f2 are two parameters which can be specifically determined according to K, the CB length. That is, supposing the bit stream with a length K is $c_0, c_1, \ldots, c_{k-1}$ and the output of the interleaver is $c'_0, c'_1, \ldots, c'_{k-1}$, $c'_i$ can be expressed as $c'_i = c_{\Pi(i)}$.

The LTE system is required to support the peak data rate of over 100 Mbps, which puts forward higher requirements for the coding and decoding rate of the channel. To satisfy the requirements, the Turbo code in the LTE must adopt the parallel decoding algorithm. For the parallel decoding of the Turbo code, the design of the interleaver should also adapt to the requirements for the parallel decoding. The inventor found that in the related art, there is still no Turbo code interleaver or method capable of performing the parallel interleaving effectively.

SUMMARY OF THE INVENTION

The disclosure provides a Turbo code parallel interleaver and a parallel interleaving method thereof. This solution may at least solve the problem above that the parallel interleaving can not be effectively performed.

According to one aspect of the disclosure, a Turbo code parallel interleaver is provided, comprising: an interleaving unit, configured to generate a column address for parallel-reading data and a row address of each row for row-interleaving the read data, input the column address to a Code Block (CB) matrix unit as a read address, input the column address after delay to the CB matrix unit as a write address, input the row address of each row to a switching output unit, and input the row address of each row after delay to a switching input unit; the switching output unit, configured to receive data of each row output by the CB matrix unit, perform inter-row interleaving for the read data of each row according to the row address of each row, and input the interleaved data to a parallel Maximum A Posteriori (MAP) unit for MAP computing, wherein the data of each row is read by the CB matrix unit according to the read address; and the switching input unit, configured to receive the row address of each row after delay from the interleaving unit, perform the inter-row interleaving for the data of each row output by the parallel MAP unit after the MAP computing according to the row address after delay, and write the interleaved data of each row into the CB matrix unit as prior information according to the write address.

In the above, the interleaving unit comprises:
a basic interleaving address recursion module, configured to perform recursion for a basic interleaving address $\Pi(i)$ from a forward direction and a backward direction respectively according to a formula of:

$\Pi(i+1) = (\Pi(i) + ((f_1 + f_2) \bmod K + (2f_2 \cdot i) \bmod K) \bmod K) \bmod K$, wherein $stu \leq i \leq stu+w$;

$\Pi(i-1) = (\Pi(i) - ((f_1 + f_2) \bmod K + (2f_2 \cdot (i-1)) \bmod K) \bmod K) \bmod K$, wherein $std \geq i \geq std - w$;

a modulo operation module, configured to obtain the column address $col\_addr(i)$ through performing a modulo operation of the basic interleaving address $\Pi(i)$ obtained by the basic interleaving address recursion module mod L;

a division operation module, configured to obtain the row address $row\_addr(0,i)$, $0 \leq i \leq L-1$ of a first row through calculating a quotient of dividing the basic interleaving address ($\Pi(i)$) obtained by the basic interleaving address recursion module by L;

an adjacent-row address computation module, configured to perform the recursion for a row address increment $\Delta(i)$ between two adjacent rows from the forward direction and the backward direction respectively according to a formula of:

$\Delta(i+1)=\Delta(i)+(2f_2) \bmod R$ wherein, $stu \leq i \leq stu+w$;

$\Delta(i-1)=\Delta(i)(2f_2) \bmod R$, wherein $std \geq i \geq std-w$; and a row address generation module, configured to calculate the row addresses of all rows row_addr(r,i) according to the formula below:

row_addr(r,i)=(row_addr(0,i)+(r·$\Delta(i)$)mod R)mod R,($0 \leq r \leq R-1, 0 \leq i \leq L-1$)

wherein during the forward recursion of the basic interleaving address recursion module or the adjacent-row address computation module, if i≥L, then i=i mod L; during the backward recursion of the basic interleaving address recursion module or the adjacent-row address computation module, if i<0, then i=L+i; and $f_1$, $f_2$ are interleaving parameters, stu is an initial position of the forward recursion in a CB (0≤stu≤K−1), std is the initial position of the backward recursion in the CB (0≤std≤K−1), L is the number of columns of a matrix in the CB matrix unit, w is a window length of the basic interleaving address recursion, R is the number of rows of the matrix in the CB matrix unit, and K is a CB length in the CB matrix unit.

In the above, the adjacent-row address computation module determines the row address increment of the initial position of the forward recursion $\Delta(stu)$ and the row address increment of the initial position of the backward recursion $\Delta(std)$ according to a formula of:

$\Delta(0)=(f_1+f_2 \cdot L) \bmod R$, $\Delta(i+1)=\Delta(i)+(2f_2) \bmod R$

In the above, the basic interleaving address recursion module determines the basic interleaving address of the initial position of the forward recursion $\Pi(stu)$ and the basic interleaving address of the initial position of the backward recursion $\Pi(std)$ according to a formula of:

$\Pi(0)=0$;

$\Pi(i+1)=(\Pi(i)+((f_1+f_2) \bmod K+(2f_2 \cdot i) \bmod K) \bmod K) \bmod K$

The first select-one-from-two module, configured to according to parity of the current number of times of the MAP operation of the parallel MAP unit, select i or the recursive basic interleaving address $\Pi(i)$ obtained by the basic interleaving address recursion module to output to the modulo operation module and the division operation module; and the second select-one-from-two module, configured to according to parity of the current number of times of the MAP operation of the parallel MAP unit, select 1 or the row address increment $\Delta(i)$ obtained by the adjacent-row address computation module to output to the row address generation module.

In the above, the switching output unit comprises R select-one-from-R modules, and each select-one-from-R module is configured to according to the row address input by the interleaving unit, select and output one channel of the data from R rows of the data read, wherein R is the number of rows of a matrix in the CB matrix unit.

In the above, the switching input unit comprises R select-one-from-R modules, and each select-one-from-R module is configured to according to the row address after delay input by the interleaving unit, select and output one row of the data from R rows of the data input by the parallel MAP unit, wherein R is the number of rows of a matrix in the CB matrix unit.

According to another aspect of the disclosure, a parallel interleaving method of a Turbo code parallel interleaver is provided, comprising: an interleaving unit generating a column address for parallel-reading data and a row address of each row for row-interleaving the read data, inputting the column address to a Code Block (CB) matrix unit as a read address, inputting the column address after delay to the CB matrix unit as a write address, inputting the row address of each row to the switching output unit, and inputting the row address of each row after delay to the switching input unit; the CB matrix unit reading data of each row corresponding to the column address according to the read address and inputting the read data of each row to the switching output unit; the switching output unit performing inter-row interleaving for the read data of each row according to the row address of each row output by the interleaving unit and inputting the interleaved data to a parallel Maximum A Posteriori (MAP) unit for MAP computing; and the switching input unit receiving the row address of each row after delay from the interleaving unit, performing the inter-row interleaving for the data of each row output by the parallel MAP unit after the MAP computing according to the row address after delay, and writing the interleaved data of each row into the CB matrix unit as prior information according to the write address.

In the above, the interleaving unit generating the column address and the row address of each row comprises:

the interleaving unit performing recursion for a basic interleaving address $\Pi(i)$ from a forward direction and a backward direction respectively according to a formula of:

$\Pi(i+1)=(\Pi(i)+((f_1+f_2) \bmod K+(2f_2 \cdot i) \bmod K) \bmod K) \bmod K$, wherein, $stu \leq i \leq stu+w$;

$\Pi(i-1)=(\Pi(i)-((f_1+f_2) \bmod K+(2f_2 \cdot (i-1)) \bmod K) \bmod K) \bmod K$, wherein, $std \geq i \geq std-w$;

the interleaving unit obtaining the column address $col_{addr}$ (i) through performing a modulo operation of the basic interleaving address $\Pi(i)$ obtained via the recursion mod L;

the interleaving unit obtaining the row address of a first row row_addr(0,i), 0≤i≤L−1 through calculating a quotient of dividing the basic interleaving address $\Pi(i)$ obtained via the recursion by L;

the interleaving unit performing the recursion for a row address increment $\Delta(i)$ between two adjacent rows from the forward direction and the backward direction respectively according to a formula of:

$\Delta(i+1)=\Delta(i)+(2f_2) \bmod R$, wherein $stu \leq i \leq stu+w$ $\Delta(i-1)=\Delta(i)-(2f_2) \bmod R$, wherein $std \geq i \geq std-w$; and the interleaving unit calculating the row addresses of all rows row_addr(r,i) according to a formula of:

row_addr(r,i)=(row_addr(0,i)+(r·$\Delta(i)$)mod R)mod R, ($0 \leq r \leq R-1, 0 \leq i \leq L-1$);

wherein during the forward recursion of the basic interleaving address or the row address increment, if i≥L, then i=i mod L; during the backward recursion of the basic interleaving address or the row address increment, if i<0, then i=L+i; and $f_1$, $f_2$ are interleaving parameters, stu is an initial position of the forward recursion in a CB (0≤stu≤K−1), std is the initial position of the backward recursion in the CB (0≤std≤K−1), L is the number of columns of a matrix in the CB matrix unit, R is the number of rows of the matrix in the CB matrix unit, and K is a CB length in the CB matrix unit.

In the above, when the interleaving unit performs the recursion for the basic interleaving address, the interleaving unit determines the basic interleaving address of the initial position of the forward recursion Π(stu) and the basic interleaving address of the initial position of the backward recursion Π(std) to a formula of:

$$\Pi(0)=0;$$

$$\Pi(i+1)=(\Pi(i)+((f_1+f_2)\bmod K+(2f_2 \cdot i)\bmod K)\bmod K)\bmod K$$

In the above, when the interleaving unit performs the recursion for the row address increment, the row address increment of the initial position of the forward recursion Δ(stu) and the row address increment of the initial position of the backward recursion Δ(std) are determined according to a formula of:

$$\Delta(0)=(f_1+f_2-L)\bmod R,$$

$$\Delta(i+1)=\Delta(i)+(2f_2)\bmod R$$

Through the disclosure, parallel reading of a column of data is realized according to the column address generated by the interleaving unit of the Turbo code parallel interleaver. Then, row interleaving is performed for the data read according to the row address of each row generated by the interleaving unit. Thus, the intra-row and inter-row interleaving of the data is realized. The switching input unit performs the row interleaving for the data of each row after the MAP computation according to the row address of each row after delay generated by the interleaving unit, and writes the interleaved data as the prior information into the position corresponding to the column address generated by the interleaving unit in the CB matrix. Thus, this solution can perform parallel deinterleaving effectively and improve the efficiency of the interleaving and deinterleaving.

BRIEF DESCRIPTION OF THE DRAWINGS

The drawings disclosed herein are provided for further understanding the disclosure, and constituting a part of the application. The exemplary embodiments of the disclosure and the description thereof are used to illustrate rather than limit the disclosure. In the drawings.

DETAILED DESCRIPTION OF THE EMBODIMENTS

The disclosure is further described hereinafter in conjunction with the drawings and the embodiments. It should be noted that the embodiments in the application and the characteristics in the embodiments can be combined with each other if no conflict occurs.

The interleaver and deinterleaver in FIG. 1 are two inverse processes. That is, an input sequence goes through the interleaving and deinterleaving and is recovered to the original sequence. And, the same effect can also be achieved by an input sequence undergoes interleaving twice. Therefore, in the embodiment of the disclosure, the interleaver and the deinterleaver on the hardware are combined into one, wherein the computed result of the deinterleaver is several clock periods later than that of the interleaver, namely the time-delay of the decoding unit 2.

Figure 2:
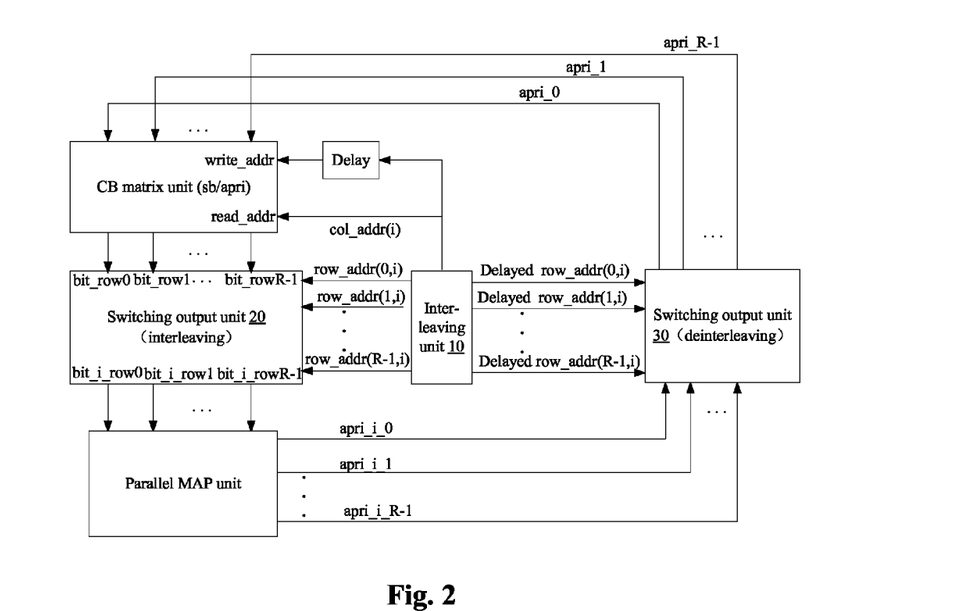
FIG. 2 is a schematic diagram of the structure of the Turbo code interleaver according to the embodiment of the disclosure.

FIG. 2 is a schematic diagram of the structure of the Turbo code parallel interleaver according to the embodiment of the disclosure. As shown in FIG. 2, the Turbo code interleaver mainly comprises: an interleaving unit 10, a switching output unit 20 and a switching input unit 30. In the above, as shown in FIG. 2, the interleaving unit 10 is configured to generate the column address for parallel-reading data and the row address of each row for row-interleaving the read data, input the column address to the CB matrix unit as the read address, input the column address after delay to the CB matrix unit as the write address, input the row address of each row to the switching output unit 20, and input the row address of each row after delay to the switching input unit 30. The switching output unit 20 is configured to receive the data of each row output by the CB matrix unit (wherein the CB matrix unit reads a column of data according to the read address above and outputs the data read to the switching output unit 20), perform the inter-row interleaving for the parallel-read data of each row according to the row address of each row output by the interleaving unit 10, and input the interleaved data to the parallel matching unit (MAP) for Max-Log-Map (MAP) operation. The switching input unit 30 is configured to receive the row address of each row after delay from the interleaving unit 10. The row address of each row input to the switching input unit 30 is delayed, so that the row address of each row received by the switching input unit 30 is kept synchronized with the time delay of the computation of the parallel MAP unit. The switching input unit 30 performs the inter-row interleaving for the data of each row output by the parallel MAP unit after the MAP computing according to the delayed address, and writes the interleaved data of each row into the CB matrix unit as the prior information according to the write address.

In the embodiment of the disclosure, the soft bit information of the CB to be decoded and the prior information used during the decoding are stored in the format of R×L matrix, wherein R represents the number of the rows of the matrix, and L represents the number of the columns of the matrix. The parallel decoding is to read out the data of R rows of one column from the matrix and according to certain mapping rules, send the R pieces of data to the parallel MAP unit for the MAP operation with R-channel parallel.

In the above, the CB matrix unit comprises four R×L matrixes, used to store the system bit sb, check bit p0, check bit p1 and the prior information apri corresponding to one CB respectively. In the above, the number of the rows of the matrix depends on the length K of the CB. Preferably, R can be determined according to the formula below:

$$R = \begin{cases} 1 & (40 \le K \le 384) \\ 2 & (392 \le K \le 768) \\ 4 & (784 \le K \le 1536) \\ 8 & (1568 \le K \le 3072) \\ 16 & (3136 \le K \le 6144). \end{cases}$$

The number of the columns of the matrix L=K/R.

Figure 3:
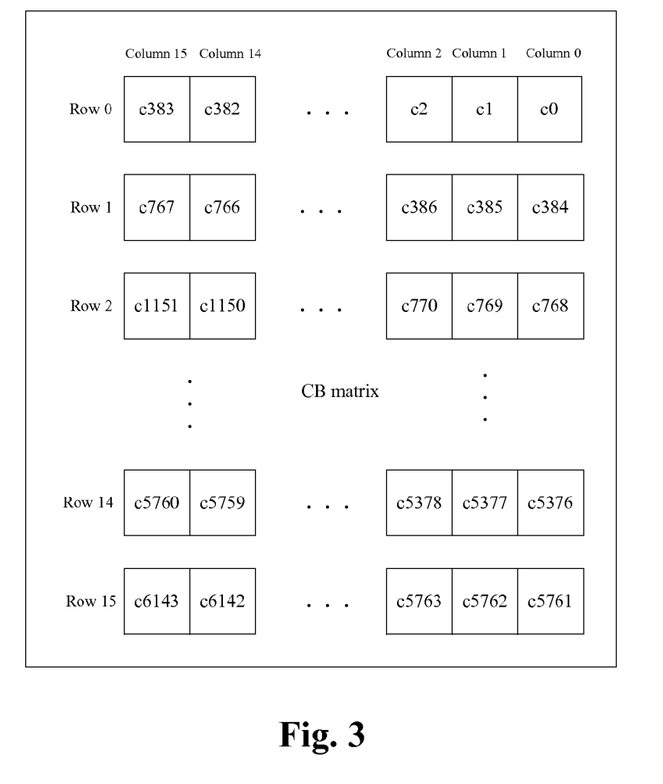
FIG. 3 is a diagram of the matrix structure stored in the CB matrix according to the embodiment of the disclosure.

For example, supposing K=6144, the bit sequence of the CB is (c0, c1, c2, . . . , c6143), and then the arrangement order of the sequence in the R×L is as shown in FIG. 3.

In the above, the check bit p0 and the check bit p1 do not need interleaving. Only one of p0 and p1 is selected to be input to the parallel MAP unit. When the current number of times of the MAP operation is an odd number, the check bit p0 is input to the parallel MAP unit. When the current number of times of the MAP operation is an even number, the check bit p1 is input to the parallel MAP unit. For the system bit sb and the prior information api, the CB matrix unit reads a column of data respectively according to the row address generated by the interleaving unit 10 and inputs the data to the switching output unit 20. The switching output unit 20 performs the row interleaving for the data of each row input according to the row address of each row generated by the interleaving unit 10, and then inputs to the parallel MAP unit. The parallel MAP unit performs MAP operation according to the input check bit, the system bit sb and the prior information of each row to obtain a column of the prior information, and inputs the column of the prior information to the switching input unit 30. The switching input unit 30 performs the interleaving for the data of each row input according to the row address of each row after delay, and writes the column of data as the data corresponding to the column address above into the position corresponding to the prior information api matrix in the CB matrix unit.

The Turbo code parallel interleaver above provided by the embodiment of the disclosure performs parallel-reading of a column of data according to the column address generated by the interleaving unit of the Turbo code parallel interleaver. And row interleaving is performed for the data read according to the row address of each row generated by the interleaving unit, so as to realize the intra-row interleaving and inter-row interleaving. The switching input unit performs the row interleaving for the data of each row after the MAP computation according to the row address of each row after delay generated by the interleaving unit, and writes the interleaved data as the prior information into the position corresponding to the column address generated by the interleaving unit in the CB matrix.

Figure 4:
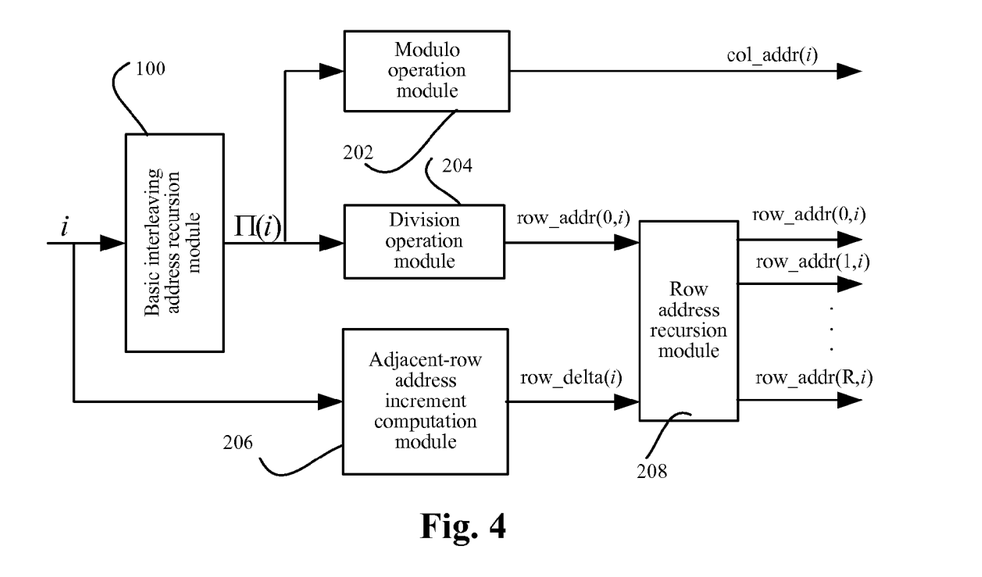
FIG. 4 is a schematic diagram of the structure of the interleaving unit according to the preferred embodiment of the disclosure.

In one preferred embodiment of the disclosure, the interleaving unit 10 can adopt the structure as shown in FIG. 4. As shown in FIG. 4, in the preferred embodiment, the interleaving unit 10 can include: a basic interleaving address recursion module 100, a modulo operation module 102, a division operation module 104, an adjacent-row address computation module 106 and a row address generation module 108.

The basic interleaving address recursion module 100 can perform the recursion for the basic interleaving address from the forward direction and the backward direction according to the formula (1-2) and the formula (1-3) respectively. The scope of the forward recursion is from Π(stu) to Π(stu+w), namely stu≤i≤stu+w. The backward recursion is from Π(std) to Π(std−w) namely std≥i≥std−w. In this case, stu is the initial position of the forward recursion in the CB, std is the initial position of the backward recursion in the CB, L is the number of the columns of the CB matrix and w is the window length of the basic interleaving address.

$$\Pi(i+1)=(\Pi(i)+((f_1+f_2)\bmod K+(2f_2\cdot i)\bmod K)\bmod K)\bmod K, \text{ wherein, } stu\leq i\leq stu+w \quad (1\text{-}2)$$

$$\Pi(i-1)=(\Pi(i)-((f_1+f_2)\bmod K+(2f_2\cdot(i-1))\bmod K)\bmod K)\bmod K, (i>0), \text{ wherein, } std\geq i\geq std-w \quad (1\text{-}3)$$

In the above, $$(2f_2\cdot i)\bmod K=(2f_2\cdot(i-1))\bmod K+(2f_2)\bmod K \quad \text{(Formula 1-4)}$$

$$(2f_2\cdot(i-1))\bmod K=(2f_2\cdot i)\bmod K(2f_2)\bmod K \quad \text{(Formula 1-5)}$$

During the forward recursion of the basic interleaving address recursion module, if i≥L, then i=i mod L. That is, during the forward recursion, i progressively increases from the initial position stu. If the column boundary is met during the progressive increasing (namely i=L), i is cleared to be zero and the progressive increase continues. That is, "increment of i mod L" is conducted so as to ensure the i value is mapped within the scope of the first row. During the backward recursion of the basic interleaving address recursion module, if i<0, then i=L+i. That is, during the backward recursion, i progressively descends from the initial position std. If the column boundary is met during the progressive descending (namely i=0), i is set to be L and the descending continues. That is, "descending value of i mod L" is conducted to ensure the i value is mapped within the scope of the first row.

In the above, R represents the number of the rows in the CB matrix, L represents the number of the columns in the CB matrix, and f1 and f2 are the interleaving parameters of the Turbo code interleaver. And, f1 and f2 correspond to the CB length K. Specifically, in the LTE system, f1 and f2 can be determined according to Table 1.

Preferably, the basic interleaving address recursion module 100 can obtain the initial values Π(stu) and Π(std) required by the recursion according to (Formula 1-6) and (Formula 1-2).

$$\Pi(0)=0 \quad \text{(Formula 1-6)}$$

$$\Pi(i+1)=(\Pi(i)+((f_1+f_2)\bmod K+(2f_2\cdot i)\bmod K)\bmod K)\bmod K \quad \text{(Formula 1-2)}$$

In the (Formula 1-2), (Formula 1-3), (Formula 1-4), (Formula 1-5), and (Formula 1-6) above, $(f_1+f_2)\bmod K$ $(2f_2)\bmod K$ and are constants that can be calculated in advance. The modulo operation can be realized through comparison and subtraction, and it can be ensured that the result of modulo operation each time is always less than K. Thus the recursion for the interleaving address is completely simplified to be comparison and multiplication & subtraction operation.

The modulo operation module 102 is configured to obtain the column address col_addr(i) through performing the modulo operation of the basic interleaving address Π(i) obtained via the recursion by the basic interleaving address recursion module 100 mod L.

TABLE 1

| i | $K_i$ | $f_1$ | $f_2$ |
|---|---|---|---|
| 1 | 40 | 3 | 10 |
| 2 | 48 | 7 | 12 |
| 3 | 56 | 19 | 42 |
| 4 | 64 | 7 | 16 |
| 5 | 72 | 7 | 18 |
| 6 | 80 | 11 | 20 |
| 7 | 88 | 5 | 22 |
| 8 | 96 | 11 | 24 |
| 9 | 104 | 7 | 26 |
| 10 | 112 | 41 | 84 |
| 11 | 120 | 103 | 90 |
| 12 | 128 | 15 | 32 |
| 13 | 136 | 9 | 34 |
| 14 | 144 | 17 | 108 |
| 15 | 152 | 9 | 38 |
| 16 | 160 | 21 | 120 |
| 17 | 168 | 101 | 84 |
| 18 | 176 | 21 | 44 |
| 19 | 184 | 57 | 46 |
| 20 | 192 | 23 | 48 |
| 21 | 200 | 13 | 50 |
| 22 | 208 | 27 | 52 |
| 23 | 216 | 11 | 36 |
| 24 | 224 | 27 | 56 |
| 25 | 232 | 85 | 58 |

TABLE 1-continued

| i | $K_i$ | $f_1$ | $f_2$ |
|---|---|---|---|
| 26 | 240 | 29 | 60 |
| 27 | 248 | 33 | 62 |
| 28 | 256 | 15 | 32 |
| 29 | 264 | 17 | 198 |
| 30 | 272 | 33 | 68 |
| 31 | 280 | 103 | 210 |
| 32 | 288 | 19 | 36 |
| 33 | 296 | 19 | 74 |
| 34 | 304 | 37 | 76 |
| 35 | 312 | 19 | 78 |
| 36 | 320 | 21 | 120 |
| 37 | 328 | 21 | 82 |
| 38 | 336 | 115 | 84 |
| 39 | 344 | 193 | 86 |
| 40 | 352 | 21 | 44 |
| 41 | 360 | 133 | 90 |
| 42 | 368 | 81 | 46 |
| 43 | 376 | 45 | 94 |
| 44 | 384 | 23 | 48 |
| 45 | 392 | 243 | 98 |
| 46 | 400 | 151 | 40 |
| 47 | 408 | 155 | 102 |
| 48 | 416 | 25 | 52 |
| 49 | 424 | 51 | 106 |
| 50 | 432 | 47 | 72 |
| 51 | 440 | 91 | 110 |
| 52 | 448 | 29 | 168 |
| 53 | 456 | 29 | 114 |
| 54 | 464 | 247 | 58 |
| 55 | 472 | 29 | 118 |
| 56 | 480 | 89 | 180 |
| 57 | 488 | 91 | 122 |
| 58 | 496 | 157 | 62 |
| 59 | 504 | 55 | 84 |
| 60 | 512 | 31 | 64 |
| 61 | 528 | 17 | 66 |
| 62 | 544 | 35 | 68 |
| 63 | 560 | 227 | 420 |
| 64 | 576 | 65 | 96 |
| 65 | 592 | 19 | 74 |
| 66 | 608 | 37 | 76 |
| 67 | 624 | 41 | 234 |
| 68 | 640 | 39 | 80 |
| 69 | 656 | 185 | 82 |
| 70 | 672 | 43 | 252 |
| 71 | 688 | 21 | 86 |
| 72 | 704 | 155 | 44 |
| 73 | 720 | 79 | 120 |
| 74 | 736 | 139 | 92 |
| 75 | 752 | 23 | 94 |
| 76 | 768 | 217 | 48 |
| 77 | 784 | 25 | 98 |
| 78 | 800 | 17 | 80 |
| 79 | 816 | 127 | 102 |
| 80 | 832 | 25 | 52 |
| 81 | 848 | 239 | 106 |
| 82 | 864 | 17 | 48 |
| 83 | 880 | 137 | 110 |
| 84 | 896 | 215 | 112 |
| 85 | 912 | 29 | 114 |
| 86 | 928 | 15 | 58 |
| 87 | 944 | 147 | 118 |
| 88 | 960 | 29 | 60 |
| 89 | 976 | 59 | 122 |
| 90 | 992 | 65 | 124 |
| 91 | 1008 | 55 | 84 |
| 92 | 1024 | 31 | 64 |
| 93 | 1056 | 17 | 66 |
| 94 | 1088 | 171 | 204 |
| 95 | 1120 | 67 | 140 |
| 96 | 1152 | 35 | 72 |
| 97 | 1184 | 19 | 74 |
| 98 | 1216 | 39 | 76 |
| 99 | 1248 | 19 | 78 |
| 100 | 1280 | 199 | 240 |
| 101 | 1312 | 21 | 82 |
| 102 | 1344 | 211 | 252 |
| 103 | 1376 | 21 | 86 |
| 104 | 1408 | 43 | 88 |
| 105 | 1440 | 149 | 60 |
| 106 | 1472 | 45 | 92 |
| 107 | 1504 | 49 | 846 |
| 108 | 1536 | 71 | 48 |
| 109 | 1568 | 13 | 28 |
| 110 | 1600 | 17 | 80 |
| 111 | 1632 | 25 | 102 |
| 112 | 1664 | 183 | 104 |
| 113 | 1696 | 55 | 954 |
| 114 | 1728 | 127 | 96 |
| 115 | 1760 | 27 | 110 |
| 116 | 1792 | 29 | 112 |
| 117 | 1824 | 29 | 114 |
| 118 | 1856 | 57 | 116 |
| 119 | 1888 | 45 | 354 |
| 120 | 1920 | 31 | 120 |
| 121 | 1952 | 59 | 610 |
| 122 | 1984 | 185 | 124 |
| 123 | 2016 | 113 | 420 |
| 124 | 2048 | 31 | 64 |
| 125 | 2112 | 17 | 66 |
| 126 | 2176 | 171 | 136 |
| 127 | 2240 | 209 | 420 |
| 128 | 2304 | 253 | 216 |
| 129 | 2368 | 367 | 444 |
| 130 | 2432 | 265 | 456 |
| 131 | 2496 | 181 | 468 |
| 132 | 2560 | 39 | 80 |
| 133 | 2624 | 27 | 164 |
| 134 | 2688 | 127 | 504 |
| 135 | 2752 | 143 | 172 |
| 136 | 2816 | 43 | 88 |
| 137 | 2880 | 29 | 300 |
| 138 | 2944 | 45 | 92 |
| 139 | 3008 | 157 | 188 |
| 140 | 3072 | 47 | 96 |
| 141 | 3136 | 13 | 28 |
| 142 | 3200 | 111 | 240 |
| 143 | 3264 | 443 | 204 |
| 144 | 3328 | 51 | 104 |
| 145 | 3392 | 51 | 212 |
| 146 | 3456 | 451 | 192 |
| 147 | 3520 | 257 | 220 |
| 148 | 3584 | 57 | 336 |
| 149 | 3648 | 313 | 228 |
| 150 | 3712 | 271 | 232 |
| 151 | 3776 | 179 | 236 |
| 152 | 3840 | 331 | 120 |
| 153 | 3904 | 363 | 244 |
| 154 | 3968 | 375 | 248 |
| 155 | 4032 | 127 | 168 |
| 156 | 4096 | 31 | 64 |
| 157 | 4160 | 33 | 130 |
| 158 | 4224 | 43 | 264 |
| 159 | 4288 | 33 | 134 |
| 160 | 4352 | 477 | 408 |
| 161 | 4416 | 35 | 138 |
| 162 | 4480 | 233 | 280 |
| 163 | 4544 | 357 | 142 |
| 164 | 4608 | 337 | 480 |
| 165 | 4672 | 37 | 146 |
| 166 | 4736 | 71 | 444 |
| 167 | 4800 | 71 | 120 |
| 168 | 4864 | 37 | 152 |
| 169 | 4928 | 39 | 462 |
| 170 | 4992 | 127 | 234 |
| 171 | 5056 | 39 | 158 |
| 172 | 5120 | 39 | 80 |
| 173 | 5184 | 31 | 96 |
| 174 | 5248 | 113 | 902 |
| 175 | 5312 | 41 | 166 |
| 176 | 5376 | 251 | 336 |
| 177 | 5440 | 43 | 170 |
| 178 | 5504 | 21 | 86 |
| 179 | 5568 | 43 | 174 |
| 180 | 5632 | 45 | 176 |
| 181 | 5696 | 45 | 178 |

TABLE 1-continued

| i | $K_i$ | $f_1$ | $f_2$ |
|---|---|---|---|
| 182 | 5760 | 161 | 120 |
| 183 | 5824 | 89 | 182 |
| 184 | 5888 | 323 | 184 |
| 185 | 5952 | 47 | 186 |
| 186 | 6016 | 23 | 94 |
| 187 | 6080 | 47 | 190 |
| 188 | 6144 | 263 | 480 |

The modulo operation module 104 is configured to obtain the row address Π(i) of the first row row_addr(0,i), 0≤i≤L−1 through calculating the quotient of dividing the basic interleaving address Π(i) obtained via the recursion by the basic interleaving address recursion module 100 by L.

The adjacent-row address calculation module 106 can perform the recursion for the row address increment Δ(i) between two adjacent rows from the forward direction and the backward direction according to (Formula 1-7) and (Formula 1-8) respectively. The scope of the forward recursion is from Δ(stu) to Δ(stu+w) (namely stu≤i≤stu+w). The scope of the backward recursion is from Δ(std) to Δ(std−w) (namely std≥i≥std−w). In this case, stu and std are the initial positions of the forward and backward recursions in the CB respectively, and L is the number of the columns of the CB matrix.

$$\Delta(i+1)=\Delta(i)+(2f_2)\mod R, \text{ wherein } stu \leq i \leq stu+w \quad \text{(Formula 1-7)}$$

$$\Delta(i-1)=\Delta(i)-(2f_2)\mod R, \text{ wherein } std \geq i \geq std-w \quad \text{(Formula 1-8)}$$

Preferably, the adjacent-row address computation module 106 can obtain the initial values Δ(stu) and Δ(std) required by the recursion in advance according to (Formula 1-7) and (Formula 1-9).

$$\Delta(0)=(f_1+f_2 \cdot L)\mod R \quad \text{(Formula 1-9)}$$

$$\Delta(i+1)=\Delta(i)+(2f_2)\mod R \quad \text{(Formula 1-7)}$$

During the forward recursion of the adjacent-row address computation module, if i≥L, then i=i mod L. During the backward recursion of the adjacent-row address computation module, if i<0, then i=L+i.

In the above, Δ(i) in (Formula 1-7), (Formula 1-8) and (Formula 1-9) represents the row address increment between two adjacent rows corresponding to the interleaving (or non-interleaving) address in Column i within the matrix in the CB matrix unit:

$$\Delta(i)=\text{row\_addr}(r+1,i)-\text{row\_addr}(r,i), (0 \leq r \leq R-1, 0 \leq i \leq L-1).$$

In (Formula 1-9), f2 is an even number, L is a multiple of 4, and R is the power of 2 and is no more than 15. Thus, $f_2 \cdot L$ is simplified to be {f2[1] & L[2],3'b000}. And, since R is the power of 2 and is no more than 15, the modulo operation of (Formula 1-7), (Formula 1-8), (Formula 1-9) and (Formula 1-10) can be simplified to be the truncation operation. To sum up, the formulae above are simplified to be comparison, multiplication & subtraction, shift, truncation operations, or simple multiplication operation. This ensures that for the hardware, the key route can be easily simplified through inserting a register to improve the performance of the circuit. And through combining the flow-line processing method, it is ensured that the recursion computation of the interleaving address can output a result each clock tick.

The row address generation module is configured to calculate the row addresses of all the rows row_addr(r,i) according to the formula below:

$$\text{row\_addr}(r,i)=(\text{row\_addr}(0,i)+(r \cdot \Delta(i)) \mod R) \mod R, \quad (0 \leq r \leq R-1, 0 \leq i \leq L-1) \quad \text{(Formula 1-10)}$$

In the above, the multiplication in the (Formula 1-10) is the multiplier of 4×4, thus ensuring easy realization on hardware.

Figure 5:
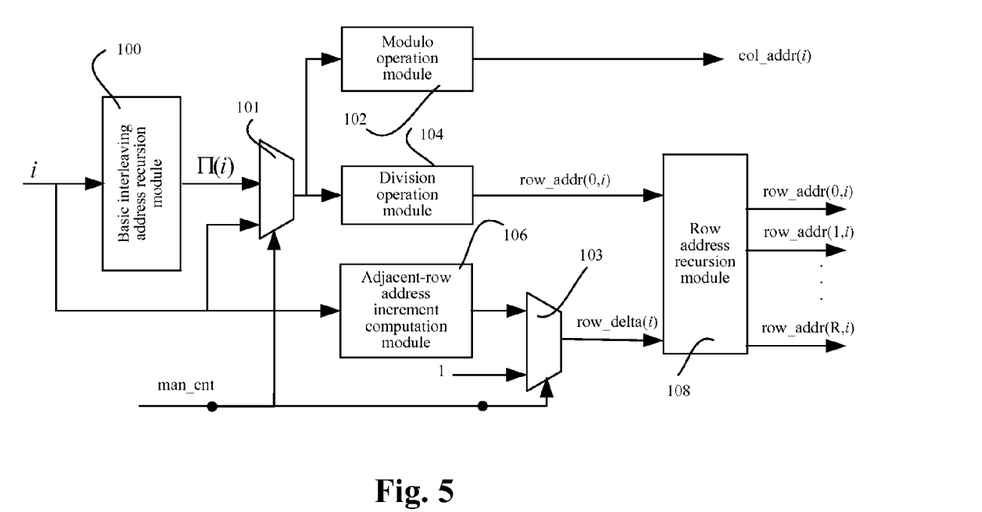
FIG. 5 is a schematic diagram of the structure of the interleaving unit according to another preferred embodiment of the disclosure.

FIG. 5 is a schematic diagram of the structure of another implementation of the interleaving unit 10 according to the embodiment of the disclosure. As shown in FIG. 5, comparing with the interleaving unit 10 as shown in FIG. 4, two select-one-from-two modules are added to the interleaving unit 10 of the implementation: the first select-one-from-two module 101 and the second select-one-from-two module 103. In the above, the first select-one-from-two module 101 determines the parity of the current MAP operation according to the value of the map_cnt of the current MAP operation. If the map_cnt is an odd number, the current MAP operation does not require interleaving. Then, the first select-one-from-two module 101 directly selects and outputs i to the modulo operation module 102 and the division operation module 104. The second select-one-from-two module 103 directly selects 1 as the row address increment of the adjacent rows and outputs it to the row address generation module 108. If the map_cnt is an even number, the current MAP requires interleaving. Then, the first select-one-from-two module 101 selects the basic interleaving address Π(i) obtained by the basic interleaving address recursion module 100 and outputs it to the modulo operation module 102 and the division operation module 104. The second select-one-from-two module 103 selects the output of the adjacent-row address computation module 106 as the row address increment of the adjacent rows and outputs it to the row address generation module 108.

It should be noted that the select-one-from-two processing of the interleaving and non-interleaving parameters processed by the two select-one-from-two modules above is only for the two matrixes used for storing the system bit sb and the prior information apri of the four matrixes in the CB matrix unit. The other two matrixes used for storing the check information p0 and p1 do not need interleaving, since the storage order (namely input sequence) of p0 in the matrix is not interleaved, and the storage order (namely input sequence) of p1 in the matrix has been interleaved. When the map_cnt is an even number, p0 is selected, and when the map_cnt is an odd number, p1 is selected. Therefore, for the two matrixes used for storing p0 and p1, one of them is selected from the CB matrix and input to the parallel MAP unit. The read address used for reading p0 and p1 from the CB matrix is not necessarily read by using the column address, but can be read by using the non-interleaving address (namely the i value in FIG. 5).

The switching output unit 20 is an R×R interleaved array, comprising R channels of input and R channels of output. It can comprise R select-one-from-R modules (preferably, the module can be a select-one-from-R circuit). The output of each select-one-from-R module is one channel selected from the R channels of input according to the row address corresponding to the select-one-from-R module from the interleaving unit. Likewise, the switching input unit 30 is also an R×R interleaved array, also comprising R channels of input, R channels of output and R select-one-from-R circuits. The row address input by the switching input unit 30 is the row address after delay output by the interleaving unit 10. The purpose of delay is to ensure synchronization with the time delay of the MAP operation. In the above, the select-one-from-R circuit can be a tree structure of selecting R/2 from R, selecting R/4 from R/2 . . . , and 1 from R/2", which can shorten the processing delay. For example, for 16-channel output, the tree structure of selecting 8 from 16, selecting 4 from 8, selecting 2 from 4 and selecting 1 from 2 can be adopted.

Figure 6:
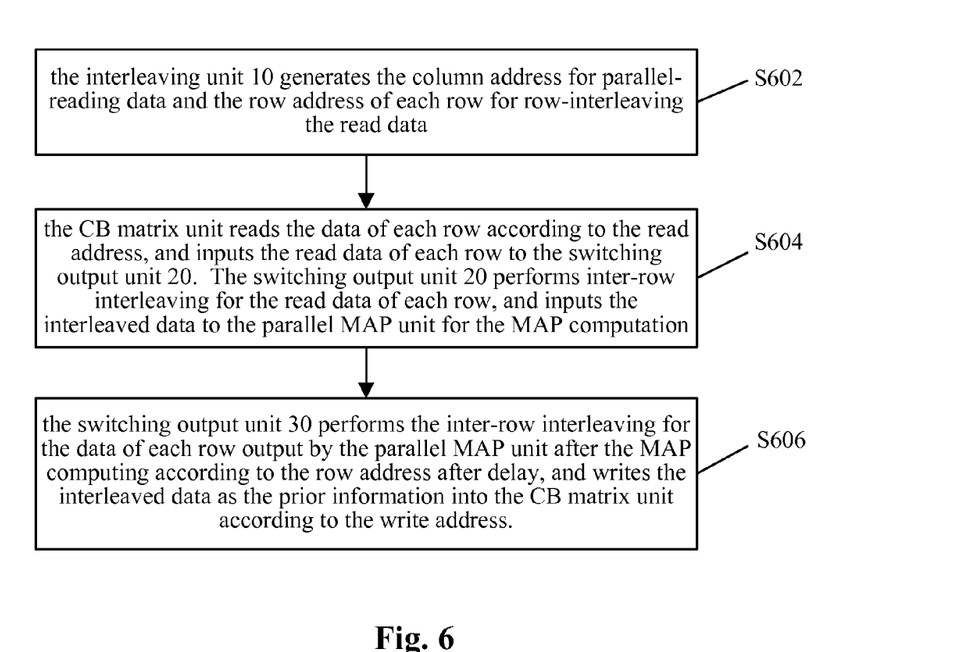
FIG. 6 is a flow chart of the parallel interleaving method of the Turbo code interleaver according to the embodiment of the disclosure.

FIG. 6 is a flow chart of the parallel interleaving method of the Turbo code parallel interleaver according to the embodiment of the disclosure. The method can be realized through the Turbo code interleaver above. In the specific implementation process, the description above can be adopted to conduct the parallel interleaving. As shown in FIG. 6, the method comprises the following steps.

Step S602, the interleaving unit 10 generates the column address for parallel-reading data and the row address of each row for row-interleaving the read data, inputs the column address to the CB matrix unit as the read address, inputs the column address after delay to the CB matrix unit as the write address, inputs the row address of each row to the switching output unit 20, and inputs the row address of each row after delay to the switching input unit 30.

For example, the interleaving unit 10 can generate the row address of each row according to the following steps.

Step 1: the interleaving unit 10 performs the recursion for the basic interleaving address $\Pi(i)$ from the forward direction and the backward direction respectively according to the formula below:

$\Pi(i+1)=(\Pi(i)+((f_1+f_2)\mod K+(2f_2 \cdot i)\mod K)\mod K)\mod K$, wherein $stu \leq i \leq stu+w$; and during the forward recursion, if $i \geq L$, then $i=i \mod L$;

$\Pi(i-1)=(\Pi(i)-((f_1+f_2)\mod K+(2f_2 \cdot (i-1))\mod K)\mod K)\mod K$, wherein $std \geq i \geq std-w$; and during the backward recursion, if $i<0$, then $i=L+i$.

In the above, $f_1, f_2$ are the interleaving parameters, stu and std are the initial positions of the forward and backward recursions in the CB respectively ($0 \leq stu \leq K-1$ and $0 \leq std \leq K-1$) w is the window length of the basic interleaving address recursion, L is the number of the columns of the matrix in the CB matrix unit, R is the number of the rows of the matrix in the CB matrix unit, and K is the CB length in the CB matrix unit.

Preferably, when the interleaving unit 10 performs the recursion for the basic interleaving address, the basic interleaving addresses, $\Pi(stu)$ and $\Pi(std)$ of the initial positions of the forward and backward recursions are determined according to the formula below:

$\Pi(0)=0$;

$\Pi(i+1)=(\Pi(i)+((f_1+f_2)\mod K+(2f_2 \cdot i)\mod K)\mod K)\mod K$.

Step 2, the interleaving unit 10 obtains the column address col_addr(i) through performing the modulo operation of the basic interleaving address $\Pi(i)$ obtained by recursion mod L.

Step 3, the interleaving unit 10 obtains the row address of the first row row_addr(0,i), $0 \leq i \leq L-1$ through calculating the quotient of dividing the basic interleaving address $\Pi(i)$ obtained by recursion by L.

Step 4, the interleaving unit 10 performs the recursion for the row address increment $\Delta(i)$ of two adjacent rows from the forward direction and the backward direction respectively according to the formula below:

$\Delta(i+1)=\Delta(i)+(2f_2)\mod R$, wherein $stu \leq i \leq stu+w$;

$\Delta(i-1)=\Delta(i)-(2f_2)\mod R$, wherein $std \geq i \geq std-w$.

Preferably, when the interleaving unit performs the recursion for the row address increment, the row address increments $\Delta(stu)$ and $\Delta(std)$ of the initial positions of the forward and backward recursions are determined according to the formulae below:

$\Delta(0)=(f_1+f_2 \cdot L)\mod R$, $\Delta(i+1)=\Delta(i)+(2f_2)\mod R$.

Step 5, the interleaving unit computes the row addresses row_addr(r,i) of all the rows according to the formula below:

row_addr$(r,i)$=(row_addr$(0,i)$+$(r \cdot \Delta(i))$mod $R$)mod $R$, $(0 \leq r \leq R-1, 0 \leq L-1)$ Step S604, the CB matrix unit reads the data of each row corresponding to the column address above according to the read address above, and inputs the read data of each row to the switching output unit 20. The switching output unit 20 performs inter-row interleaving for the read data of each row according to the row address of each row input by the interleaving unit 10, and inputs the interleaved data to the parallel MAP unit for the MAP computation.

Step S606, the switching output unit 30 receives the row address of each row after delay from the interleaving unit 10, performs the inter-row interleaving for the data of each row output by the parallel MAP unit after the MAP computing according to the row address after delay, and writes the interleaved data as the prior information into the CB matrix unit according to the write address above.

Through the above parallel interleaving method of the Turbo code interleaver provided by the embodiment of the disclosure, the intra-row and inter-row interleaving of the data is realized by parallel-reading of a column of data according to the column address generated by the interleaving unit of the Turbo code parallel interleaver. Row interleaving is performed for the read data according to the row address of each row generated by the interleaving unit. The switching input unit performs the row interleaving for the data of each row after the MAP computation according to the row address of each row after delay generated by the interleaving unit, and writes the interleaved data as the prior information into the position corresponding to the column address generated by the interleaving unit in the CB matrix. Thus, this solution performs the parallel deinterleaving effectively and improves the efficiency of the interleaving and deinterleaving.

In the practical applications, the above parallel interleaving method of the Turbo code interleaver provided by the disclosure can be realized through the above embodiments of Turbo code interleaver. The corresponding technical effects of the embodiments of the Turbo code interleaver above can be achieved. No repeated detail is given herein.

From the description above, we can see that the disclosure realizes the following technical effects: 1. supporting the Turbo parallel decoding and increasing the decoding speed; 2. the computation process of row & column addresses adopts the method of recursion without the requirement for any caching and table searching operations, thus saving hardware resources; 3. the multiplication operation and the modulo operation involved in the recursion of the interleaving row & column addresses are resolved into simple addition and comparison operation, thus simplifying the critical path and improving the hardware performance; and 4. combining with the pipeline processing method, this solution can output one result of the computing the interleaving address each clock tick, thus ensuring the linear rate of the data stream of the decoder.

It is obvious for those skilled in this field that the modules or steps of the disclosure above can be also realized by a general computer device. They can be integrated in a single computer device or distributed on the network composed of several computer devices, or alternatively achieved by executable codes of a computer device, so as to store them in a storage unit for execution by a computer device, or make them into different integrated circuit modules or make multiple modules or steps of them to a single integrated circuit module for realization of the disclosure. In this way, the disclosure is not restricted to the combination of any specific hardware and software.

The description above is just the preferred embodiments of the disclosure, and should not be used to limit the disclosure. For those skilled in this field, the disclosure can have various alterations and changes. Any such change, equivalent substitution or improvement made within the principle of the disclosure should be covered in the protection scope of the disclosure.

What is claimed is:

1. A Turbo code parallel interleaver, comprising a hardware processor configured to execute program units stored on a non-transitory computer readable medium, the program units comprising:

an interleaving unit configured to generate a column address for parallel-reading data and a row address of each row for row-interleaving the parallel-reading data, input the column address to a Code Block (CB) matrix unit as a read address, input the column address after delay to the CB matrix unit as a write address, input the row address of each row to a switching output unit, and input the row address of each row after delay to a switching input unit;

the switching output unit configured to receive data of each row output by the CB matrix unit, perform inter-row interleaving for the received data of each row according to the row address of each row, and input the interleaved data to a parallel Maximum A Posteriori (MAP) unit for MAP computing, wherein the data of each row is read by the CB matrix unit according to the read address; and the switching input unit configured to receive the row address of each row after delay from the interleaving unit, perform the inter-row interleaving for the data of each row output by the parallel MAP unit after the MAP computing according to the row address after delay, and write the interleaved data of each row into the CB matrix unit as prior information according to the write address.

2. The Turbo code parallel interleaver according to claim 1, wherein the interleaving unit comprises:

a basic interleaving address recursion module configured to perform recursion for a basic interleaving address $\Pi(i)$ from a forward direction and a backward direction respectively according to a formula of:

$\Pi(i+1)=(\Pi(i)+((f_1+f_2)\bmod K+(2f_2 \cdot i)\bmod K)\bmod K)\bmod K$, wherein $stu \leq i \leq stu+w$;

$\Pi(i-1)=(\Pi(i)-((f_1+f_2)\bmod K+(2f_2 \cdot (i-1))\bmod K)\bmod K)\bmod K$, wherein $std \geq i \geq std-w$;

a modulo operation module configured to obtain the column address col_addr(i) through performing a modulo operation of the basic interleaving address $\Pi(i)$ obtained by the basic interleaving address recursion module mod L;

a division operation module configured to obtain the row address row_addr(0,i), $0 \leq i \leq L-1$ of a first row through calculating a quotient of dividing the basic interleaving address ($\Pi(i)$) obtained by the basic interleaving address recursion module by L;

an adjacent-row address computation module configured to perform the recursion for a row address increment $\Delta(i)$ between two adjacent rows from the forward direction and the backward direction respectively according to a formula of:

$\Delta(i+1)=\Delta(i)+(2f_2)\bmod R$, wherein, $stu \leq i \leq stu+w$;

$\Delta(i-1)=\Delta(i)-(2f_2)\bmod R$, wherein, $std \geq i \geq std-w$; and a row address generation module configured to calculate the row addresses of all rows row_addr(r,i) according to the formula below:

row_addr(r,i)=(row_addr(0,i)+(r·$\Delta(i)$)mod R)mod R, $(0 \leq r \leq R-1, 0 \leq i \leq L-1)$ wherein during the forward recursion of the basic interleaving address recursion module or the adjacent-row address computation module, if $i \geq L$, then i=i mod L; during the backward recursion of the basic interleaving address recursion module or the adjacent-row address computation module, if i<0, then i=L i−; and $f_1$, $f_2$ are interleaving parameters, stu is an initial position of the forward recursion in a CB ($0 \leq stu \leq K-1$), std is the initial position of the backward recursion in the CB ($0 \leq std \leq K-1$), L is the number of columns of a matrix in the CB matrix unit, w is a window length of the basic interleaving address recursion, R is the number of rows of the matrix in the CB matrix unit, and K is a CB length in the CB matrix unit.

3. The Turbo code parallel interleaver according to claim 2, wherein the adjacent-row address computation module determines the row address increment of the initial position of the forward recursion $\Delta(stu)$ and the row address increment of the initial position of the backward recursion $\Delta(std)$ to a formula of:

$\Delta(0)=(f_1+f_2 \cdot L)\bmod R$, $\Delta(i+1)=\Delta(i)+(2f_2)\bmod R$.

4. The Turbo code parallel interleaver according to claim 2, further comprising:

a first select-one-from-two module configured to according to parity of the current number of times of at least one MAP operation of the parallel MAP unit, select i or the recursive basic interleaving address $\Pi(i)$ obtained by the basic interleaving address recursion module to output to the modulo operation module and the division operation module; and a second select-one-from-two module configured to according to parity of the current number of times of the at least one MAP operation of the parallel MAP unit, select 1 or the row address increment $\Delta(i)$ obtained by the adjacent-row address computation module to output to the row address generation module.

5. The Turbo code parallel interleaver according to claim 1, wherein the switching input unit comprises R select-one-from-R modules, and each select-one-from-R module is configured to according to the row address after delay input by the interleaving unit, select and output one row of the data from R rows of the data input by the parallel MAP unit, wherein R is the number of rows of a matrix in the CB matrix unit.

6. A parallel interleaving method of a Turbo code parallel interleaver, wherein the Turbo code parallel interleaver has a hardware processor comprising an interleaving unit, a Code Block (CB) matrix unit, and a switching input unit, the method comprising:

the interleaving unit generating a column address for parallel-reading data and a row address of each row for row-interleaving the parallel-reading data, inputting the column address to the Code Block (CB) matrix unit as a read address, inputting the column address after delay to the CB matrix unit as a write address, inputting the row address of each row to the switching output unit, and inputting the row address of each row after delay to the switching input unit;

the CB matrix unit reading data of each row corresponding to the column address according to the read address and inputting the read data of each row to the switching output unit; the switching output unit performing inter-row interleaving for the read data of each row according to the row address of each row output by the interleaving unit and inputting the interleaved data to a parallel Maximum A Posteriori (MAP) unit for MAP computing; and the switching input unit receiving the row address of each row after delay from the interleaving unit, performing the inter-row interleaving for the data of each row output by the parallel MAP unit after the MAP computing according to the row address after delay, and writing the interleaved data of each row into the CB matrix unit as prior information according to the write address.

7. The method according to claim 6, wherein the interleaving unit generating the column address and the row address of each row comprises:

the interleaving unit performing recursion for a basic interleaving address Π(i) from a forward direction and a backward direction respectively according to a formula of:

$\Pi(i+1)=(\Pi(i)+((f_1+f_2)\bmod K+(2f_2 \cdot i)\bmod K)\bmod K)\bmod K$, wherein, $stu \leq i \leq stu+w$;

$\Pi(i-1)=(\Pi(i)-((f_1+f_2)\bmod K+(2f_2 \cdot (i-1))\bmod K)\bmod K)\bmod K$, wherein, $std \geq i \geq std-w$;

the interleaving unit obtaining the column address col_addr (i) through performing a modulo operation of the basic interleaving address Π(i) obtained via the recursion mod L;

the interleaving unit obtaining the row address of a first row row_$addr$(0,i),0≤i≤L−1 through calculating a quotient of dividing the basic interleaving address Π(i) obtained via the recursion by L;

the interleaving unit performing the recursion for a row address increment Δ(i) between two adjacent rows from the forward direction and the backward direction respectively according to a formula of:

$\Delta(i+1)=\Delta(i)+(2f_2)\bmod R$, wherein $stu \leq i \leq stu+w$ $\Delta(i-1)=\Delta(i)-(2f_2)\bmod R$, wherein $std \geq i \geq std-w$; and the interleaving unit calculating the row addresses of all rows row_addr(r,i) according to a formula of:

row_addr(r,i)=(row_addr(0,i)+(r·Δ(i))mod R)mod R, (0≤r≤R−1,0≤i≤L−1);

wherein during the forward recursion of the basic interleaving address or the row address increment, if i≥L , then i=i mod L ; during the backward recursion of the basic interleaving address or the row address increment, if i<0, then i=L i−; and $f_1$, $f_2$ are interleaving parameters, stu is an initial position of the forward recursion in a CB (0≤stu≤K−1), std is the initial position of the backward recursion in the CB (0≤std≤K−1), L is the number of columns of a matrix in the CB matrix unit, R is the number of rows of the matrix in the CB matrix unit, and K is a CB length in the CB matrix unit.

8. The method according to claim 7, wherein when the interleaving unit performs the recursion for the basic interleaving address, the interleaving unit determines the basic interleaving address of the initial position of the forward recursion Π(stu) and the basic interleaving address of the initial position of the backward recursion Π(std) according to a formula of:

$\Pi(0)=0$;

$\Pi(i+1)=(\Pi(i)+((f_1+f_2)\bmod K+(2f_2 \cdot i)\bmod K)\bmod K)\bmod K$.

9. The method according to claim 7, wherein when the interleaving unit performs the recursion for the row address increment, the row address increment of the initial position of the forward recursion Δ(stu) and the row address increment of the initial position of the backward recursion Δ(std) determined according to a formula of:

$\Delta(0)=(f_1+f_2 \cdot L)\bmod R$, $\Delta(i+1)=\Delta(i)+(2f_2)\bmod R$.

10. The Turbo code parallel interleaver according to claim 3, further comprising:

a first select-one-from-two module configured to according to parity of the current number of times of at least one MAP operation of the parallel MAP unit, select i or the recursive basic interleaving address Π(i) obtained by the basic interleaving address recursion module to output to the modulo operation module and the division operation module; and a second select-one-from-two module configured to according to parity of the current number of times of the at least one MAP operation of the parallel MAP unit, select 1 or the row address increment Δ(i) obtained by the adjacent-row address computation module to output to the row address generation module.

11. The Turbo code parallel interleaver according to claim 2, wherein the basic interleaving address recursion module determines the basic interleaving address of the initial position of the forward recursion Π(stu) and the basic interleaving address of the initial position of the backward recursion Π(std) according to a formula of:

$\Pi(0)=0$;

$\Pi(i+1)=(\Pi(i)+((f_1+f_2)\bmod K+(2f_2 \cdot i)\bmod K)\bmod K)\bmod K$.

12. The Turbo code parallel interleaver according to claim 11, further comprising:

a first select-one-from-two module configured to according to parity of the current number of times of at least one MAP operation of the parallel MAP unit, select i or the recursive basic interleaving address Π(i) obtained by the basic interleaving address recursion module to output to the modulo operation module and the division operation module; and a second select-one-from-two module configured to according to parity of the current number of times of the at least one MAP operation of the parallel MAP unit, select 1 or the row address increment Δ(i) obtained by the adjacent-row address computation module to output to the row address generation module.

13. The Turbo code parallel interleaver according to claim 1, wherein the switching output unit comprises R select-one-from-R modules, and each select-one-from-R module is configured to according to the row address input by the interleaving unit, select and output one channel of the data from R rows of the data read, wherein R is the number of rows of a matrix in the CB matrix unit.

* * * * *